(12) United States Patent
Wheaton et al.

(10) Patent No.: US 10,416,267 B2
(45) Date of Patent: Sep. 17, 2019

(54) APPARATUS AND METHOD FOR CALIBRATION OF TIME ORIGIN OF AN RF PULSE IN MRI DATA ACQUISITION SYSTEMS

(71) Applicant: Toshiba Medical Systems Corporation, Otawara-shi (JP)

(72) Inventors: Andrew James Wheaton, Vernon Hills, IL (US); Michael R. Thompson, Vernon Hills, IL (US)

(73) Assignee: Canon Medical Systems Corporation, Otawara-shi (JP)

( * ) Notice: Subject to any disclaimer, the term of this patent is extended or adjusted under 35 U.S.C. 154(b) by 188 days.

(21) Appl. No.: 15/401,749

(22) Filed: Jan. 9, 2017

(65) Prior Publication Data

US 2018/0196115 A1    Jul. 12, 2018

(51) Int. Cl.
*G01V 3/00* (2006.01)
*G01R 33/58* (2006.01)
*G01R 33/48* (2006.01)
G01R 33/483 (2006.01)
G01R 33/565 (2006.01)

(52) U.S. Cl.
CPC ....... *G01R 33/583* (2013.01); *G01R 33/4816* (2013.01); *G01R 33/4833* (2013.01); *G01R 33/5659* (2013.01); *G01R 33/56572* (2013.01)

(58) Field of Classification Search
USPC ....................................................... 324/309
See application file for complete search history.

(56) References Cited

U.S. PATENT DOCUMENTS 5,545,991 A * 8/1996 Nauerth ............. G01R 33/4818
                                                                    324/307
5,672,969 A * 9/1997 Zhou ................. G01R 33/56572
                                                                    324/309

(Continued)

FOREIGN PATENT DOCUMENTS

WO    2015/082128 A1    6/2015
WO    2016/075020 A1    5/2016

OTHER PUBLICATIONS

S. Hafner, Fast Imaging in Liquids and Solids With the Back-projection Low Angle ShoT (BLAST) Technique, Magnetic Resonance Imaging, vol. 12, No. 7, pp. 1047-1051, 1994.

(Continued)

*Primary Examiner* — Rodney E Fuller
(74) *Attorney, Agent, or Firm* — Oblon, McClelland, Maier & Neustadt, L.L.P.

(57) ABSTRACT

An apparatus and method are disclosed for determining a time origin of an input RF pulse of a plurality of input RF pulses. The method includes generating an RF echo based on the plurality of input RF pulses, a time-duration between the input RF pulses being controllable in order to determine a time instance corresponding to an ideal position of the RF echo. The method further includes acquiring a data signal corresponding to a scan of a subject, and computing a time-difference between a measured peak of the acquired data signal and the time instance corresponding to the ideal position of the RF echo, the computed time difference corresponding to a measure of a time-shift of an effective magnetic center of the input RF pulse.

14 Claims, 11 Drawing Sheets

(56) References Cited

U.S. PATENT DOCUMENTS

| | | | | |
|---|---|---|---|---|
| 6,188,219 B1 * | 2/2001 | Reeder | ............... | G01R 33/58 |
| | | | | 324/307 |
| 7,863,895 B2 | 1/2011 | Ma | | |
| 8,552,727 B2 | 10/2013 | Umeda | | |
| 8,717,023 B2 * | 5/2014 | Griswold | ............ | G01R 33/448 |
| | | | | 324/307 |
| 2003/0109781 A1 * | 6/2003 | Zhang | ............ | G01R 33/56554 |
| | | | | 600/410 |
| 2009/0134871 A1 | 5/2009 | Yui | | |
| 2014/0097840 A1 | 4/2014 | Grodzki | | |
| 2015/0177349 A1 | 6/2015 | Foxall | | |

OTHER PUBLICATIONS

Yaotang Wu, PhD, et al., Bone Mineral Imaged in Vivo by $^{31}$P Solid State MRI of Human Wrists, Journal of Magnetic Resonance Imaging 34:623-633 (2011).

David M. Grodzki, et al., Ultrashort Echo Time Imaging Using Pointwise Encoding Time Reduction With Radial Acquisition (PETRA), Magnetic Resonance in Medicine 67:510-518 (2012).

Masahiro Ida, MD, et al., Quiet T1-Weighted Imaging Using PETRA, Initial Clinical Evaluation in Intracranial Tumor Patients, Journal of Magnetic Resonance Imaging 41:447-453 (2015).

* cited by examiner

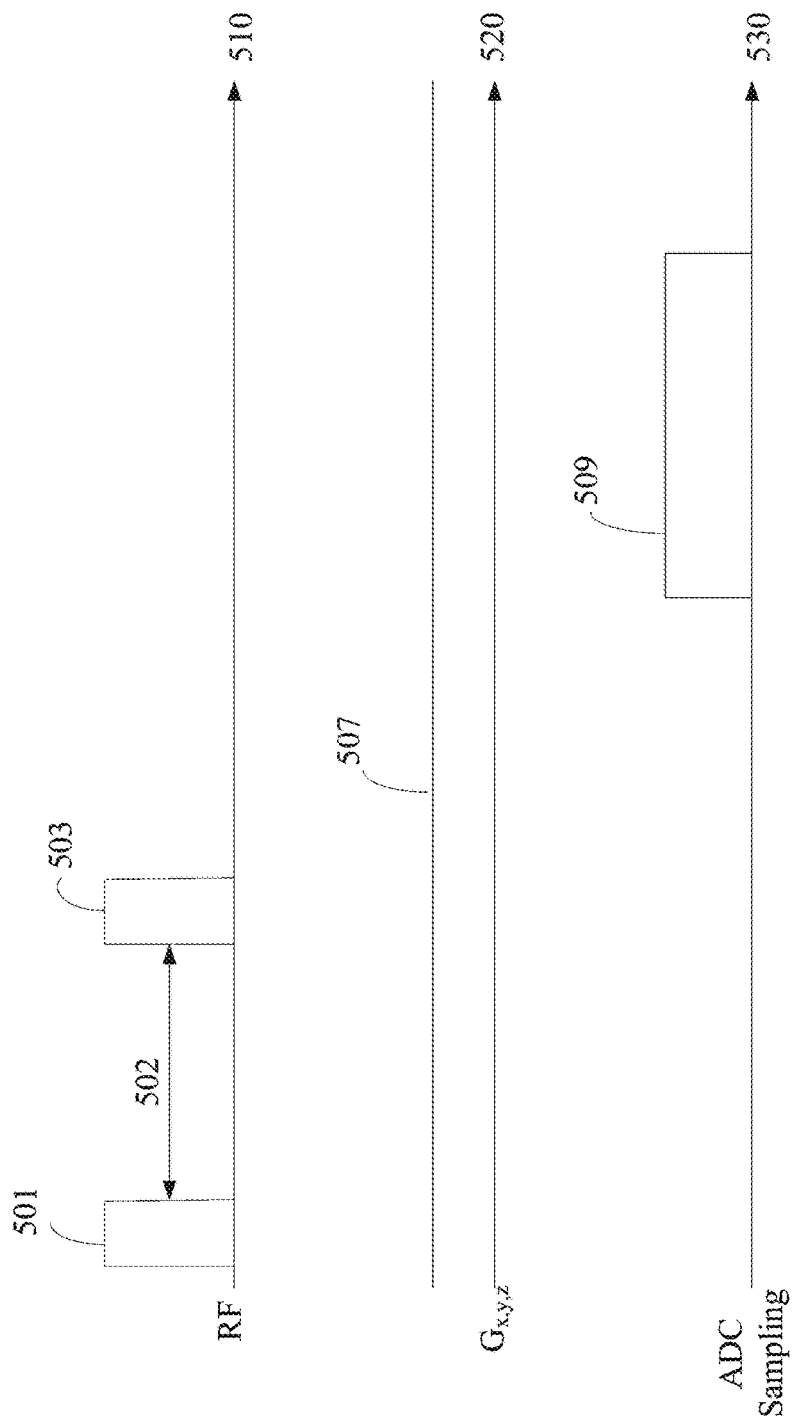

# APPARATUS AND METHOD FOR CALIBRATION OF TIME ORIGIN OF AN RF PULSE IN MRI DATA ACQUISITION SYSTEMS

BACKGROUND

Field

The present disclosure relates generally to a technique of determining a time origin of an RF pulse in an MRI data acquisition system.

Description of Related Art

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In MRI data acquisition techniques, such as zero-echo-time (ZTE) and pointwise-encoding-time-reduction with radial-acquisition (PETRA), there is typically a transition in a magnitude of a gradient coil before the application of input RF pulses. Data is acquired in a readout period, which is also referred to as an acquisition time-period. Upon application of the input RF pulses, there is a certain time-delay in the commencement of the acquisition period.

Acquired data is typically stored in a k-space matrix. Due to the time-delay incurred between the transmission of RF pulses and the commencement of the acquisition period, data corresponding to the center of the k-space matrix is usually mismatched. Such mismatched k-space data results in image reconstructions that may be plagued with artifacts. Moreover, the exact duration of the time-delay is unknown. As such, reconstruction mechanisms typically face the problem of correcting k-space data in order to enhance the quality of the reconstructed image. Accordingly, there is a requirement to determine the exact duration of the time-delay.

BRIEF DESCRIPTION OF THE DRAWINGS

Various embodiments of this disclosure that are proposed as examples will be described in detail with reference to the following figures, wherein like numerals reference like elements, and wherein:

FIG. 5A illustrates according to an embodiment, exemplary signal waveforms depicting the generation of a spin-echo;

DETAILED DESCRIPTION OF EMBODIMENTS

Figure 1:
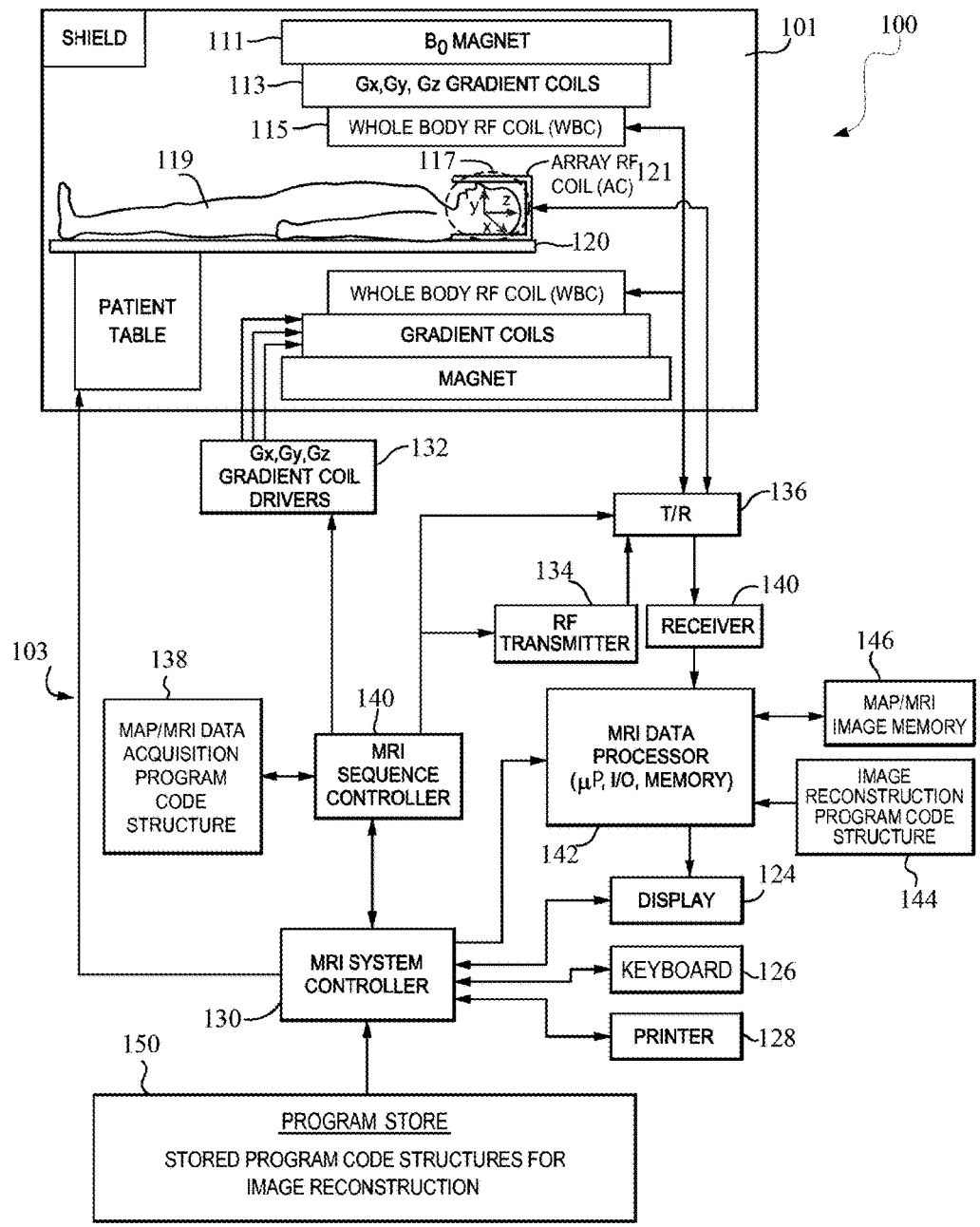
FIG. 1 depicts an exemplary schematic block diagram of an MRI system.

An aspect of the present disclosure provides for a method for determining a time origin of an input radiofrequency (RF) pulse of a plurality of input RF pulses. The method comprises the steps of generating by circuitry, an RF echo based on the plurality of input RF pulses, a time-duration between the input RF pulses being controllable in order to determine a time instance corresponding to an ideal position of the RF echo. The method further acquires a data signal corresponding to a scan of a subject; and computes a time-difference between a measured peak of the acquired data signal and the time instance corresponding to the ideal position of the RF echo, the computed time difference corresponding to a measure of a time-shift of an effective magnetic center (defined herein as the effective time origin of the MRI signal generation) of the input RF pulse.

In an embodiment of the present disclosure, there is provided a device for determining a time origin of an input RF pulse of a plurality of input RF pulses. The device comprises circuitry which is configured to: generate an RF echo based on the plurality of input RF pulses, a time-duration between the input RF pulses being controllable in order to determine a time instance corresponding to an ideal position of the RF echo, acquire a data signal corresponding to a scan of a subject, and compute a time-difference between a measured peak of the acquired data signal and the time instance corresponding to the ideal position of the RF echo, the computed time difference corresponding to a measure of a time-shift of the ideal time origin of the input RF pulse.

In another embodiment, there is provided a non-transitory computer-readable medium including computer program instructions, which when executed by a computer, causes the computer to perform a method for determining a time origin of an input RF pulse of a plurality of input RF pulses. The method comprises the steps of: generating an RF echo based on the plurality of input RF pulses, a time-duration between the input RF pulses being controllable in order to determine a time instance corresponding to an ideal position of the RF echo; acquiring a data signal corresponding to a scan of a subject; and computing a time-difference between a measured peak of the acquired data signal and the time instance corresponding to the ideal position of the RF echo, the computed time difference corresponding to a measure of a time-shift of an effective time origin of the input RF pulse.

Exemplary embodiments are illustrated in the referenced figures of the drawings. It is intended that the embodiments and figures disclosed herein are to be considered illustrative rather than restrictive. No limitation on the scope of the technology and of the claims that follow is to be imputed to the examples shown in the drawings and discussed herein.

The embodiments are mainly described in terms of particular processes and systems provided in particular implementations. However, the processes and systems will operate effectively in other implementations. Phrases such as 'an embodiment', 'one embodiment', and 'another embodiment' may refer to the same or different embodiments. The embodiments will be described with respect to methods and compositions having certain components. However, the methods and compositions may include more or less components than those shown, and variations in the arrangement and type of the components may be made without departing from the scope of the present disclosure.

The exemplary embodiments are described in the context of methods having certain steps. However, the methods and compositions operate effectively with additional steps and steps in different orders that are not inconsistent with the exemplary embodiments. Thus, the present disclosure is not intended to be limited to the embodiments shown, but is to be accorded the widest scope consistent with the principles and features described herein and as limited only by the appended claims.

Furthermore, where a range of values is provided, it is to be understood that each intervening value between an upper and lower limit of the range—and any other stated or intervening value in that stated range is encompassed within the disclosure. Where the stated range includes upper and lower limits, ranges excluding either of those limits are also included. Unless expressly stated, the terms used herein are intended to have the plain and ordinary meaning as understood by those of ordinary skill in the art. Any definitions are intended to aid the reader in understanding the present disclosure, but are not intended to vary or otherwise limit the meaning of such terms unless specifically indicated.

Turning to FIG. 1, there is depicted according to an embodiment, an exemplary magnetic resonance imaging (MRI) system 100. The MRI system 100 depicted in FIG. 1 includes a gantry 101 (shown in a schematic cross-section) and various related system components 103 interfaced therewith. At least the gantry 101 is typically located in a shielded room. The MRI system geometry depicted in FIG. 1 includes a substantially coaxial cylindrical arrangement of the static field $B_0$ magnet 111, a Gx, Gy, and Gz gradient coil set 113, and a large whole-body RF coil (WBC) assembly 115. Along a horizontal axis of this cylindrical array of elements is an imaging volume 117 shown as substantially encompassing the head of a patient 119 supported by a patient table 120.

One or more smaller array RF coils 121 can be more closely coupled to the patient's head (referred to herein, for example, as "scanned object" or "object") in imaging volume 117. As those in the art will appreciate, compared to the WBC (whole-body coil), relatively small coils and/or arrays, such as surface coils or the like, are often customized for particular body parts (e.g., arms, shoulders, elbows, wrists, knees, legs, chest, spine, etc.). Such smaller RF coils are referred to herein as array coils (AC) or phased-array coils (PAC). These can include at least one coil configured to transmit RF signals into the imaging volume, and a plurality of receiver coils configured to receive RF signals from an object, such as the patient's head, in the imaging volume.

The MRI system 100 includes a MRI system controller 130 that has input/output ports connected to a display 124, a keyboard 126, and a printer 128. As will be appreciated, the display 124 may be of the touch-screen variety so that it provides control inputs as well. A mouse or other I/O device(s) can also be provided.

The MRI system controller 130 interfaces with a MRI sequence controller 140, which, in turn, controls the Gx, Gy, and Gz gradient coil drivers 132, as well as the RF transmitter 134, and the transmit/receive switch 136 (if the same RF coil is used for both transmission and reception). The MRI sequence controller 140 includes suitable program code structure 138 for implementing MRI imaging (also known as nuclear magnetic resonance, or NMR, imaging) techniques including parallel imaging. MRI sequence controller 140 can be configured for echo-planar imaging (EPI) and/or parallel imaging. Moreover, the MRI sequence controller 140 can facilitate one or more preparation scan (pre-scan) sequences, and a scan sequence to obtain a main scan magnetic resonance (MR) image (referred to as a diagnostic image). MR data from pre-scans can be used, for example, to determine sensitivity maps for RF coils 115 and/or 121 (sometimes referred to as coil sensitivity maps or spatial sensitivity maps), and to determine unfolding maps from parallel imaging.

The MRI system components 103 include an RF receiver 140 providing input to data processor 142 so as to create processed image data, which is sent to display 124. The MRI data processor 142 is also configured to access previously generated MR data, images, and/or maps, such as, for example, coil sensitivity maps, parallel image unfolding maps, ghost reduction maps, distortion maps and/or system configuration parameters 146, and MRI image reconstruction program code structures 144 and 150.

In one embodiment, the MRI data processor 142 includes processing circuitry. The processing circuitry can include devices such as an application-specific integrated circuit (ASIC), configurable logic devices (e.g., simple programmable logic devices (SPLDs), complex programmable logic devices (CPLDs), and field programmable gate arrays (FPGAs), and other circuit components that are arranged to perform the functions recited in the present disclosure.

The processor 142 executes one or more sequences of one or more instructions contained in the program code structures 144 and 150. Alternatively, the instructions can be read from another computer-readable medium, such as a hard disk or a removable media drive. One or more processors in a multi-processing arrangement can also be employed to execute the sequences of instructions contained in the program code structures 144 and 150. In alternative embodiments, hard-wired circuitry can be used in place of or in combination with software instructions. Thus, the disclosed embodiments are not limited to any specific combination of hardware circuitry and software.

Additionally, it must be appreciated that the term "computer-readable medium" as used herein refers to any non-transitory medium that participates in providing instructions to the processor 142 for execution. A computer readable medium may take many forms, including, but not limited to, non-volatile media or volatile media. Non-volatile media includes, for example, optical, magnetic disks, and magneto-optical disks, or a removable media drive. Volatile media includes dynamic memory.

Also illustrated in FIG. 1 is a generalized depiction of an MRI system program store (memory) 150, where stored program code structures (e.g., for image reconstruction with reduced or eliminated ghosting artifact, for defining graphical user interfaces and accepting operator inputs to same, etc.) are stored in non-transitory computer-readable storage media accessible to the various data processing components of the MRI system 100. As those in the art will appreciate, the program store 150 may be segmented and directly connected, at least in part, to different ones of the system 103 processing computers having most immediate need for such stored program code structures in their normal operation (i.e., rather than being commonly stored and connected directly to the MRI system controller 130).

Additionally, the MRI system 100 as depicted in FIG. 1 can be utilized to practice exemplary embodiments described herein below. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Furthermore, not only does the physical state of the processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes an image reconstruction map (e.g., coil sensitivity map, unfolding map, ghosting map, a distortion map etc) generation process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure, as does a particular structure of computer control program codes that, when sequentially loaded into instruction registers and executed by one or more CPUs of the MRI system 100, causes a particular sequence of operational states to occur and be transitioned through within the MRI system 100.

The exemplary embodiments described below provide a technique of measuring a time origin of an input RF pulse of a plurality of input RF pulses. Specifically, embodiments described herein provide a mechanism of directly measuring a timing error associated with a MRI data acquisition processes (such as zero-echo-time (ZTE), pointwise-encoding-time-reduction-with radial-acquisition (PETRA)), etc. The correct determination of the timing error allows for accurately positioning acquired k-space data onto a grid ("gridding"), which leads to an accurate reconstruction of the image while reducing artifacts. It must be appreciated that the ZTE and PETRA acquisition techniques are only used as examples to highlight the applicability of the method of determining a time origin of an input RF pulse. The techniques of the present disclosure are equally applicable for the purposes of calibrating any system.

Specifically, the method enables the determination of the effective magnetic center or time origin of an RF pulse, and thereby removes any ambiguity that may be associated with gradient timing or performance.

MRI images are formed by acquiring nuclear magnetic resonance RF response signals (e.g., free-induction decay, gradient echo, spin-echo data) that is spatially encoded for respective points in k-space, which is a data matrix obtained directly from the MRI system before any kind of processing, such as Fourier transformation, is applied.

The k-space represents the spatial frequency information in one, two, or three dimensions of an object. The k-space is defined by the space covered by the phase, and frequency-encoded data. The relationship between k-space data and image data is a Fourier transformation. The data acquisition matrix contains raw data before image processing. In 2-dimensional (2D) Fourier transform imaging, a line of data corresponds to the digitized MR signal at a particular phase encoding level. The position in k-space is directly related to the time integral of the applied gradient across the object being imaged. Every point in the raw data matrix contains part of the information for the complete image. A point in the raw data matrix does not correspond to a point in the image matrix. The outer rows of the raw data matrix, the high spatial frequencies, provide information regarding the borders and contours of the image (i.e., the detail of the structures), while the inner rows of the matrix, i.e., the low spatial frequencies, provide information on the general contrast of the image.

In one embodiment, an MRI sequence is an ordered combination of RF and gradient pulses designed to acquire data to form the image. The data to create an MR image is obtained in a series of steps. First, the tissue magnetization is excited using an RF pulse, which can be applied simultaneously with a slice-select gradient. The other two characteristic elements of the sequence are phase encoding and frequency encoding/read out, which are required to spatially localize the protons in the other two dimensions. Finally, after the data has been collected, the process is repeated for a series of phase encoding steps.

Figure 2:
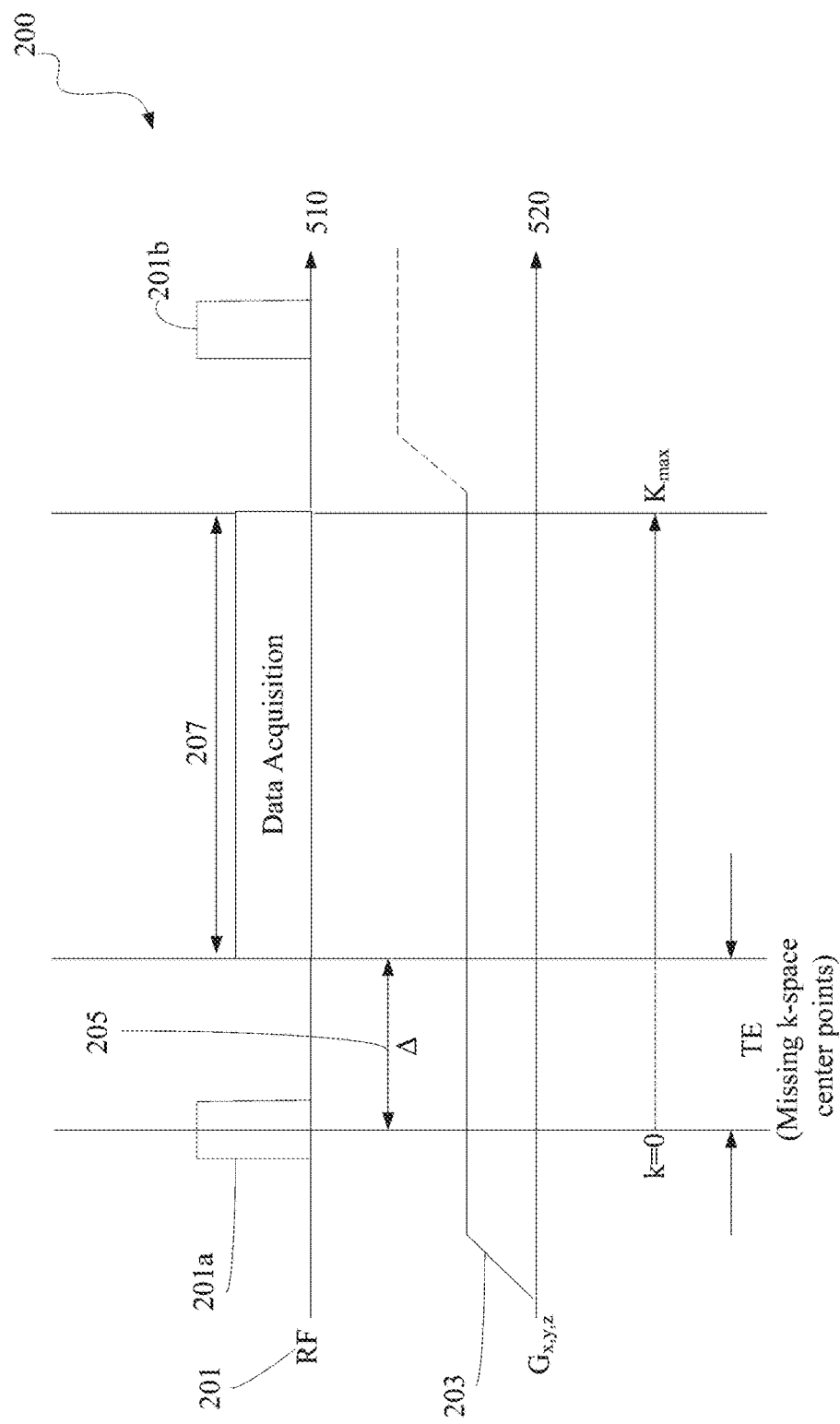
FIG. 2 depicts an exemplary zero-echo time data acquisition waveform.

FIG. 2 illustrates an exemplary ZTE data acquisition waveform 200. In ZTE data acquisition, a gradient waveform 203 transitions (i.e., changes amplitudes) at a time instant before the transmission of an input RF signal 201. For instance, as shown in FIG. 2, the gradient waveform 203 changes amplitude before the transmission of the first RF pulse 201*a*.

Data is acquired in an acquisition period 207, which begins after a finite time-delay 205, with respect to a time origin of the RF pulse 201*a*. The finite time-delay is referred to herein as a "timing error," and is represented by A. Note that the gradient waveform 203 is maintained at constant amplitude for a time-duration that extends from a time instant slightly before the transmission of the RF pulse 201*a*, to a time instant slightly after the end of the data acquisition period 207. Furthermore, upon completion of the data acquisition period 207, the gradient waveform 203 transitions to an increased amplitude, before the transmission of a subsequent RF pulse 201*b*.

Due to the incurred timing error 205, data corresponding to the center k-space positions in the k-space matrix is missed. The missed k-space data points render the image reconstruction process ineffective. Specifically, the reconstructed image will include imaging artifacts. Furthermore, as the exact duration of the timing error is unknown, the degree to which the reconstructed image includes artifacts is also not known. Thus, it is important to obtain an accurate estimate of the time origin of the input RF pulse.

Figure 3A:
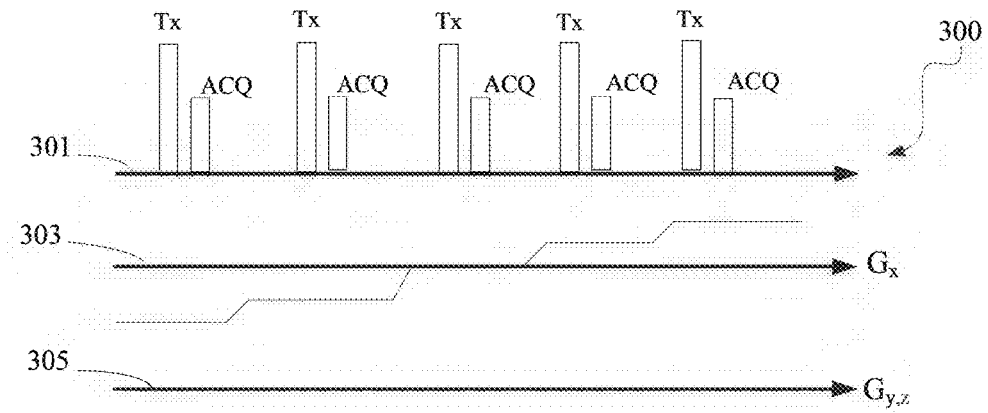
FIG. 3A illustrates an exemplary transmission-acquisition waveform, and a pair of gradient waveforms corresponding to PETRA.

A similar situation as that described in the above ZTE data acquisition technique is also experienced in the PETRA data acquisition technique. FIG. 3A illustrates an exemplary transmission-acquisition waveform, and a pair of gradient waveforms, respectively, corresponding to the PETRA acquisition technique. In FIG. 3A, waveform 301 corresponds to a transmission-acquisition waveform, and waveforms 303 and 305, respectively, correspond to a pair of gradient waveforms.

Figure 3B:
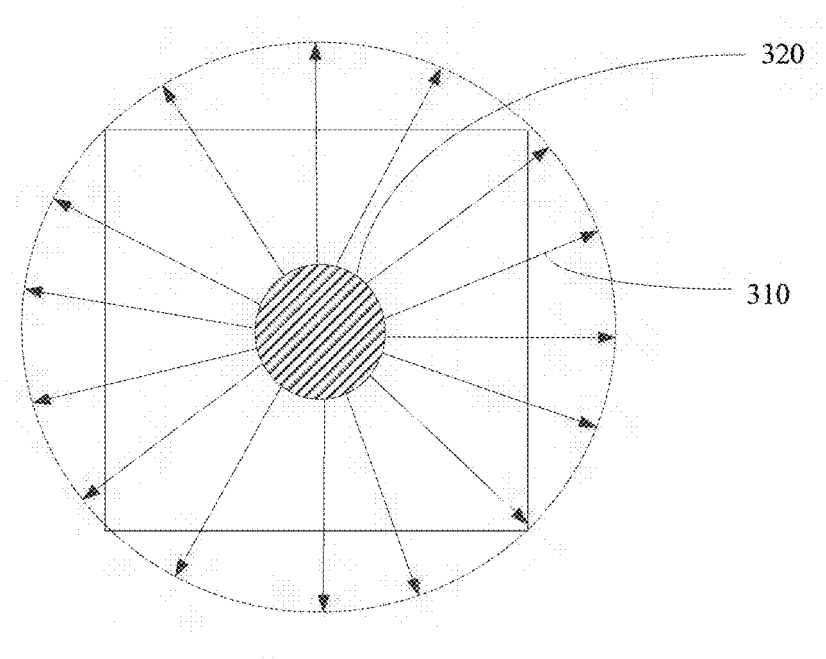
FIG. 3B depicts an exemplary k-space region corresponding to PETRA.

FIG. 3B depicts an exemplary k-space region of the PETRA data acquisition technique. In FIG. 3B, the arrow 310 depicts the direction of data acquisition in PETRA. Due to the timing error, data belonging to center k-space positions is mismatched. As shown in FIG. 3B, the circular region 320 corresponds to the region of the k-space where data points are missing. Furthermore, the exact boundary of the circular region 320 is unknown. Thus, the degree to which the reconstructed image includes artifacts is also not known.

Accordingly, as stated above, it is beneficial to develop a method that accurately estimates the duration of the timing error, or stated in another manner, it is beneficial to determine a time origin of the input RF pulse. The duration of the timing error depends on a "magnetic-center" of the RF pulse. Specifically, the magnetic center of the RF pulse corresponds to a position in time when the magnetic spin isochromats begin acquiring phase, otherwise known as the time origin of the RF pulse. A successful determination of the time origin of the RF pulse allows for the manipulation of the k-space data in order to reconstruct the image in an efficient manner.

It must be appreciated that one approach to determine the exact duration of the time origin is to analytically estimate the time origin based on the waveform shape of the RF pulse. However, this approach is not feasible as hardware non-linearities can cause deviations from the analytical solution. For instance, non-linearities intrinsic to an RF amplifier can cause the output response to deviate from an ideal response. Moreover, other hardware non-linearities or timing imperfections can cause error in the estimation of the time origin, which in turn causes artifacts in the reconstructed image. Additionally, the magnitude of error is time-dependent as well as hardware-dependent, i.e., different types of hardware can produce different output results, and moreover, the output may vary as function of time.

Furthermore, an empirical technique can be utilized to estimate an error in the time origin based on a "grid-shift" parameter. Specifically, the grid-shift parameter corresponds to a mismatch between the assumed and actual location of data in k-space due to timing errors in the acquisition. A magnitude of the grid-shift parameter is used to estimate the timing correction. A drawback of such an approach in estimating the timing error is that the grid-shift parameter is estimated in a manual fashion by inspecting the image quality. As such, human interaction and time are required in executing and interpreting the image data. Moreover the output is subject to human interpretation. Additionally, such an empirical technique must be repeated on each hardware configuration of the MRI system, as the shift in the timing error is dependent on the type of MRI scanner in use.

Figure 4A:
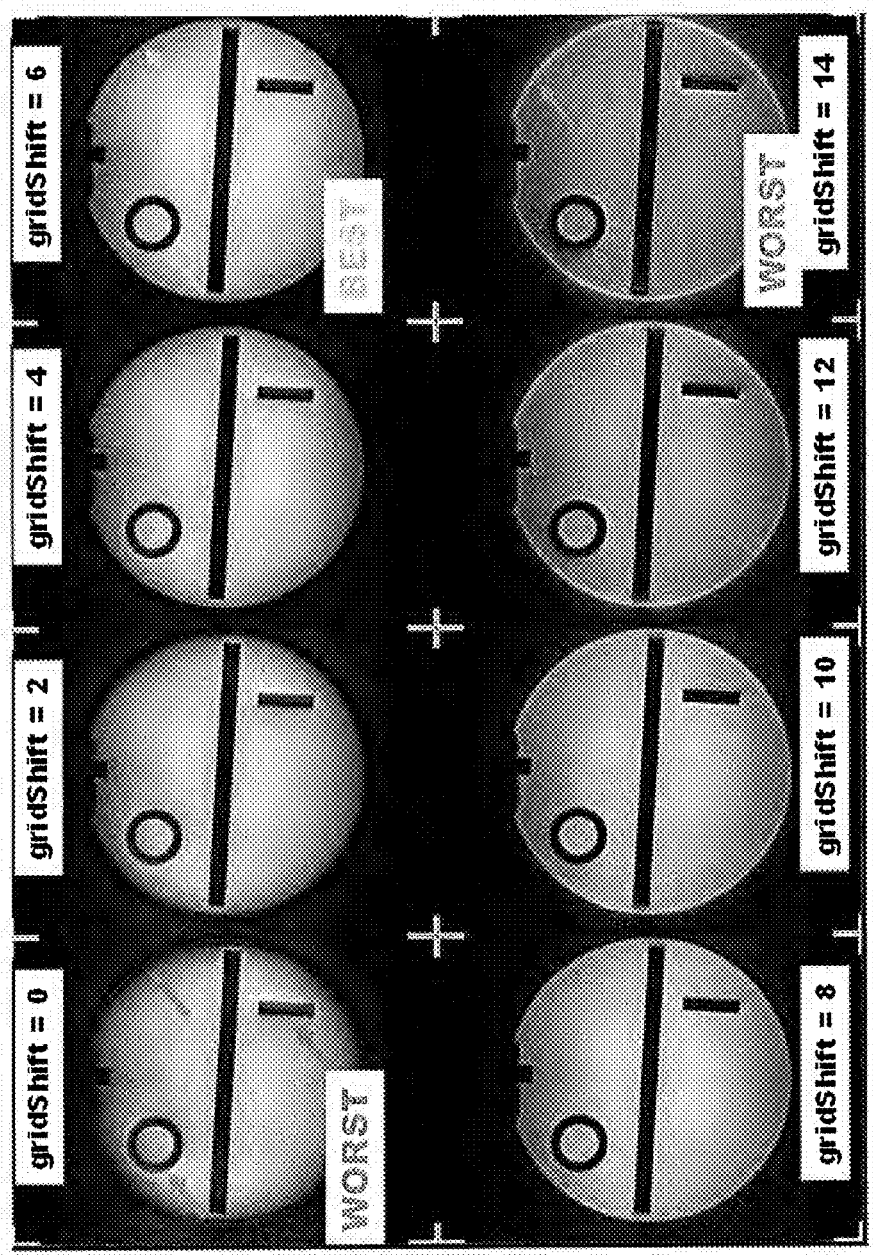
FIG. 4A illustrates an exemplary snapshot depicting effects of an empirical estimation process on an image reconstruction.

In order to illustrate the effects of human intervention in the above-described empirical estimation of the timing error, FIG. 4A illustrates an exemplary snapshot depicting effects of an empirical estimation process on an image reconstruction of a phantom (e.g., an ACR phantom).

Figure 4B:
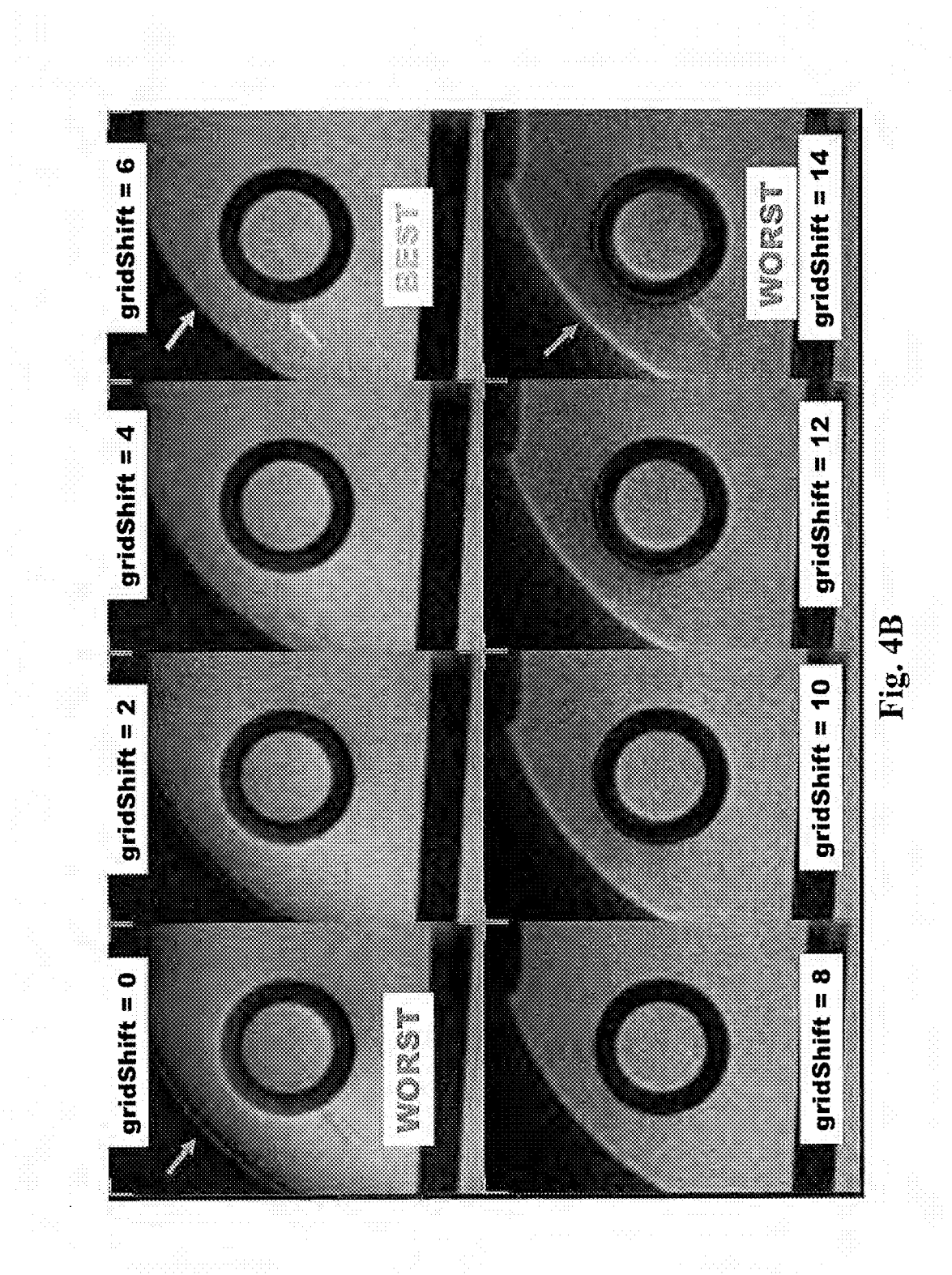
FIG. 4B illustrates a magnified view of the snapshot of FIG. 4B.

Specifically, FIG. 4A depicts a snapshot illustrating the results of choosing a particular value for the grid-shift parameter in the empirical estimation process. In FIG. 4A, image artifacts in the reconstruction of the ACR phantom image are depicted for several values of the grid-shift parameter. FIG. 4A illustrates the reconstructed image of the phantom for grid-shift values ranging from 0-14 microseconds. It is observed that the reconstructed image corresponding to a grid-shift value of 0 and 14 microseconds results in many artifacts, whereas the grid-shift value of 6 microseconds results in an image reconstruction with the fewest artifacts. For sake of clarity, a magnified view of the snapshot of FIG. 4A is depicted in FIG. 4B.

Accordingly, in what follows, a calibration technique to measure the time shift of the time origin of an RF pulse is described. In other words, the calibration technique described herein enables a measurement of a time origin of an RF pulse. The calibration technique is based on the generation of a spin-echo, which is a type of an MRI sequence. An echo sequence such as a gradient-echo (GE) sequence is a type of MRI sequence that includes a series of RF excitation pulses, each separated by a repetition time. Data is acquired at some characteristic time after the application of the RF excitation pulses, defined herein as the echo-time. In one embodiment, a spin-echo (SE) sequence is similar to the GE sequence with the exception that there is at least one additional RF refocusing pulse. Following the RF excitation pulse, the magnetization vector lies in the transverse plane. Due to macro and microscopic variation in the perceived magnetic field, some spin isochromats process more slowly while others process faster. The result is a reduction in the net vector sum of spins, a process known as "T2* dephasing." An RF refocusing pulse is then applied to 'flip' the spin isochromats so that after the flip is completed, the previously slower isochromats process faster, and the previously fast isochromats process slower. After a further time delay, a spin echo is formed. The position of the RF echo occurs after a time delay following the RF refocusing pulse equal to the duration separating the effective time origins of the RF excitation pulse and RF refocusing pulse.

FIG. 5A illustrates, according to an embodiment, exemplary signal waveforms depicting the generation of a spin-echo. The generated spin-echo is utilized in determining the adjustment to the time origin, $\Delta$.

Referring to FIG. 5A, an RF signal 510 that includes a pair of RF pulses 501 and 503 is used to generate the spin-echo as described previously. The input RF pulses 501 and 503 are separated by a predetermined amount of time 502 and have a substantially similar pulse time-duration and waveform shape. Moreover, the RF pulses have a substantially similar flip angle, which is defined as an amount of rotation that a net magnetization experiences during application of the RF pulse. It must be appreciated that the predetermined amount of time 502 between the input RF pulses 501 and 503 can be controlled in manner such that an ideal location of the echo signal can be obtained at a desired position within a sampling window 509. Moreover, it must be appreciated that during the generation of the spin-echo, the gradient waveform 520 is maintained at constant amplitude 507. In doing so, the generation of a narrow echo peak signal is enabled, thereby provisioning easy detection of the echo signal. By one embodiment, by utilizing a uniform gradient provides the advantageous ability of removing ambiguity in gradient errors or perturbations in the measurement of the effective time origin of the RF pulse.

Figure 5B:
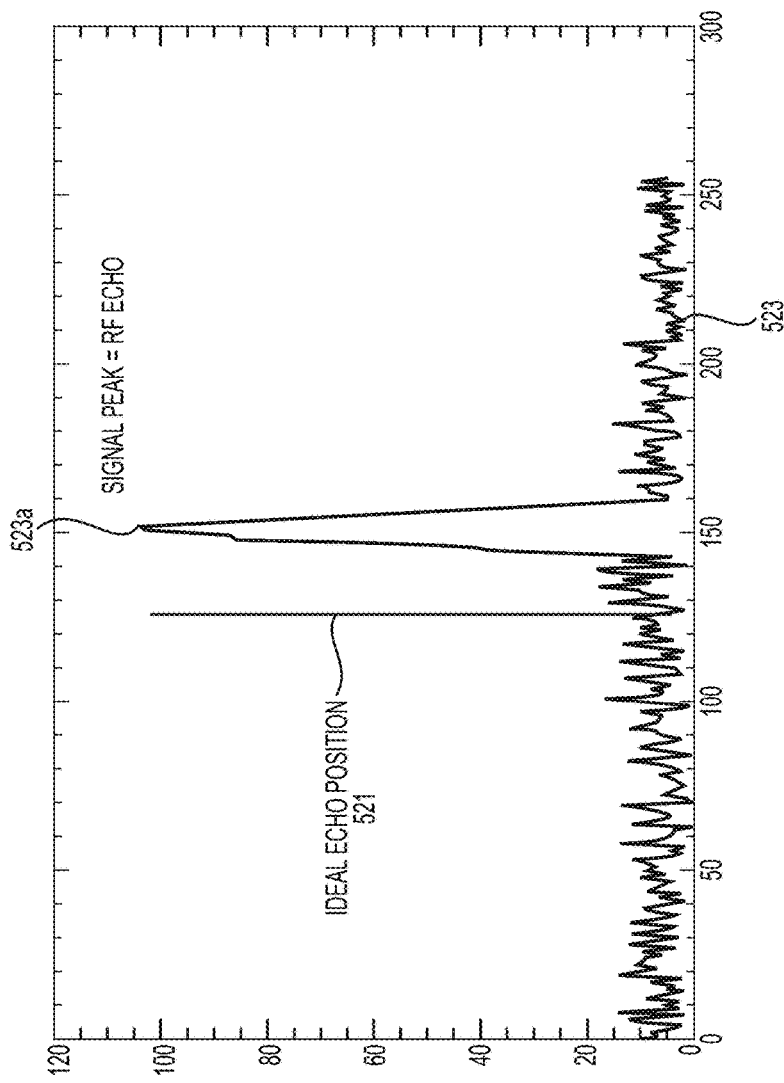
FIG. 5B depicts a snapshot illustrating locations of the spin echo and a signal peak corresponding to an acquired scan of a subject, respectively.

According to one embodiment, upon the generation of the spin-echo, a scan of a subject (e.g. a phantom, such as a 14 cm oil cube or the like) is obtained. Further, a measured peak position of an acquired data signal corresponding to the scan of the subject is determined. Thereafter, a time-difference between the occurrence of the measured peak of the acquired data signal, and the time instant corresponding to the ideal location of the spin-echo is computed. Specifically, as shown in FIG. 5B, the line indicated as 521 corresponds to the ideal location of the spin-echo signal that is generated based on a pair of RF pulses. Further, the acquired data signal is represented as reference symbol 523. A measured peak of the acquired data signal is represented as reference symbol 523*a*. The time difference between the ideal echo position (521) and the measured peak of the acquired data signal (523*a*) is computed. The computed time difference corresponds to a measure of the timing correction (Δ), i.e., a measure of time-shift of a time origin of the input RF pulse.

Figure 6:
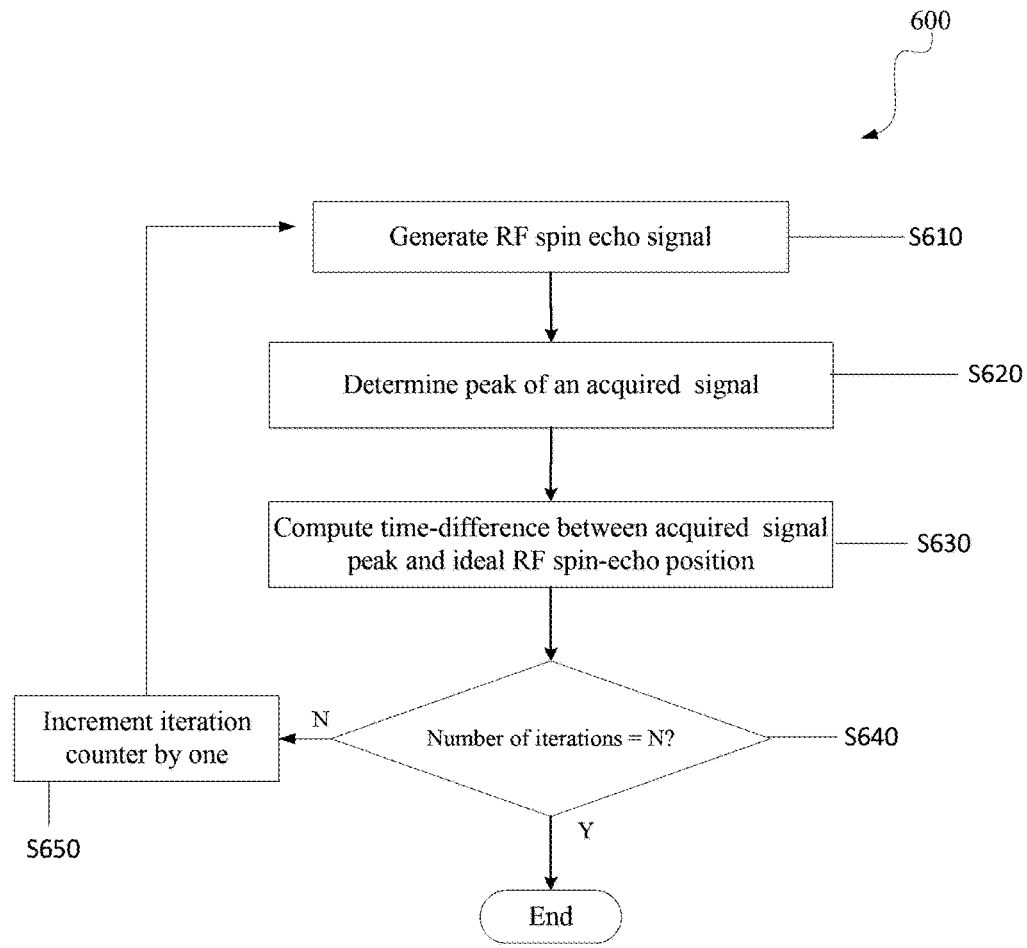
FIG. 6 depicts according to an embodiment, an exemplary flowchart illustrating the steps performed in measuring a time origin of an RF pulse.

FIG. 6 shows an exemplary flowchart 600 illustrating the steps performed in computing the time origin of an RF pulse.

The process in step S610 generates a spin-echo signal. In one embodiment, a pair of RF pulses as depicted in FIG. 5A can be used to generate the spin-echo. Note that the time-duration between the RF pulses is controllable, such that the ideal location of the occurrence of the spin-echo is achievable. During the generation of the spin-echo, a gradient waveform is maintained at constant amplitude. It must be appreciated that although the generation of the spin-echo as described above is performed by a pair of RF pulses, a plurality of input RF pulses can be used to generate the spin-echo.

Further, in step S620, a measured peak (i.e., an actual observed peak) of the acquired data signal is determined.

In step S630, the location of the measured peak of the acquired signal is compared to the ideal echo position. Specifically, a time difference is computed between the measured peak of the acquired signal and the ideal echo position. In one embodiment, the computed time difference corresponds to the time shift of the magnetic center of the RF pulse. In other words, the computed time difference corresponds to the measured time-shift from the ideal time origin of the input RF pulse.

According to one embodiment, at least a pair of RF pulses (see step S610) can be sufficient to implement the above-described method to measure the time-shift of the input RF pulse. However, with a goal of improving the accuracy of the above-described method, a repetition of the generation of spin-echo signals and data acquisition of the scanned subject can be performed a predetermined number of iterations (N).

Accordingly, the process in step S640 performs a query to determine whether N iterations of generation of spin-echo signals and data acquisition have been performed. If the response to the query is negative, the process moves to step S650 wherein a counter that tracks a number of iterations performed is incremented by one. Thereafter, the process loops back to repeat the steps S610-S630. If the response to the query in step S640 is affirmative, the process 600 terminates.

Upon completing the repetition of the spin-echo generation and data acquisition of the scanned subject, a measure of the time shift of the time origin of an RF pulse, in one embodiment, can be based on the computed time-differences of the iterations, as described below with reference to FIG. 8A and FIG. 8B. Details regarding the repetition of the data acquisition and spin-echo generation are described below with reference to FIG. 7. By one embodiment, the calibration process as described above with reference to FIG. 6 can be performed once, or may alternatively be repeated at predetermined time instances. Moreover, the calibration process may be triggered by a hardware change in the MRI scanner. Further, the calibration process as described above enables an accurate computation of the time-shift of the magnetic center of the RF pulse. In doing so, k-space data is efficiently reconstructed, which provisions for accurate image reconstruction.

Figure 7:
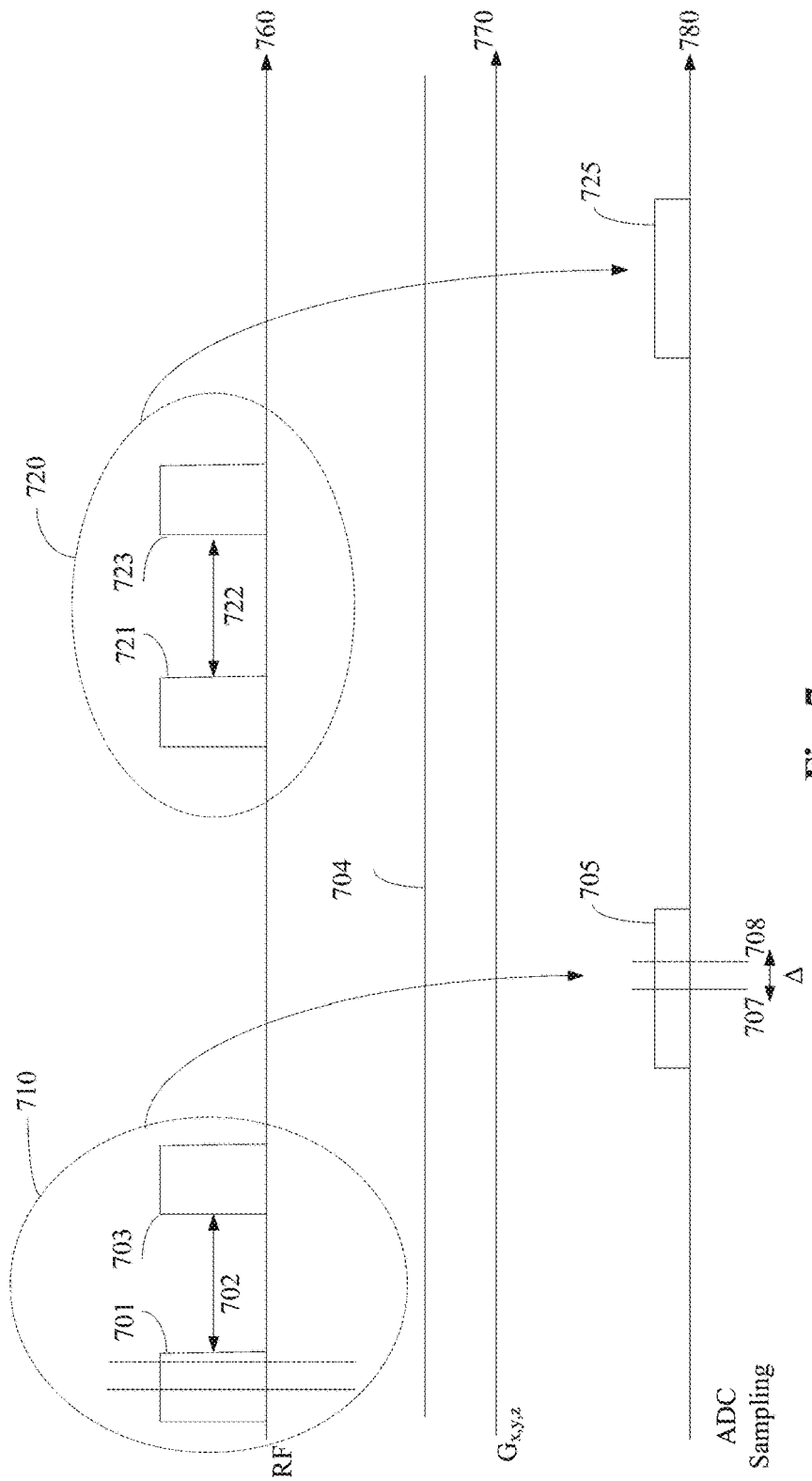
FIG. 7 depicts according to an embodiment, an exemplary data acquisition repetition process.

FIG. 7 depicts, according to one embodiment, an exemplary graph illustrating a data acquisition repetition process.

In FIG. 7, an RF signal 760, which includes a first pair 710 of RF pulses (701 and 703, respectively), is used to generate a spin-echo. A time-duration between the RF pulses 701 and 703 is controllable in a manner such that the ideal location of the echo signal can be obtained at a desired position within a sampling window 705. For instance, as shown in FIG. 7, the ideal location of the spin-echo is depicted at a time instance represented as 707. Note that a gradient waveform 770 is maintained at constant amplitude 704 during the generation of the first spin-echo.

Further, a scan of a subject (e.g., a phantom) is obtained, and a peak of an acquired data signal (that lies in the sampling window 705) corresponding to the scan of the subject is measured. As shown in FIG. 7, the measured peak of the acquired data signal is depicted to occur at a time instant represented as reference symbol 708. Thereafter, a time-difference between the occurrence of the measured peak of the acquired data signal 708 and the time instant corresponding to the ideal position of the RF echo 707 is computed.

Further, a second pair 720 of RF pulses (721 and 723, respectively) is used to generate a second spin-echo signal. A time-duration 722 between the RF pulses 721 and 723 is also controllable in a manner such that the ideal position of the second echo signal can be obtained at a desired location within a subsequent sampling window 725. Thus, in such a manner, the generation of the echo-signals and the data acquisition is repeated for a predetermined number of iterations.

According to one embodiment, the above process can be repeated for N iterations, wherein the time duration between the RF pulses can be increased by a predetermined amount (e.g., 1 microsecond) for each iteration. In doing so, the positions of subsequent echoes shift within their corresponding sampling windows. Moreover, it must be appreciated that the total time for the N iterations is of the order of a few seconds. For instance, for a time of repetition between consecutive iterations being 500 milliseconds, a total of 20 seconds is required to perform the above-described repetition for 40 iterations.

The following describes a processing framework that processes the computed time-differences between the occurrence of the measured peak of the acquired data signals and the time instance corresponding to ideal positions of the spin-echoes for the N iterations.

Figure 8A:
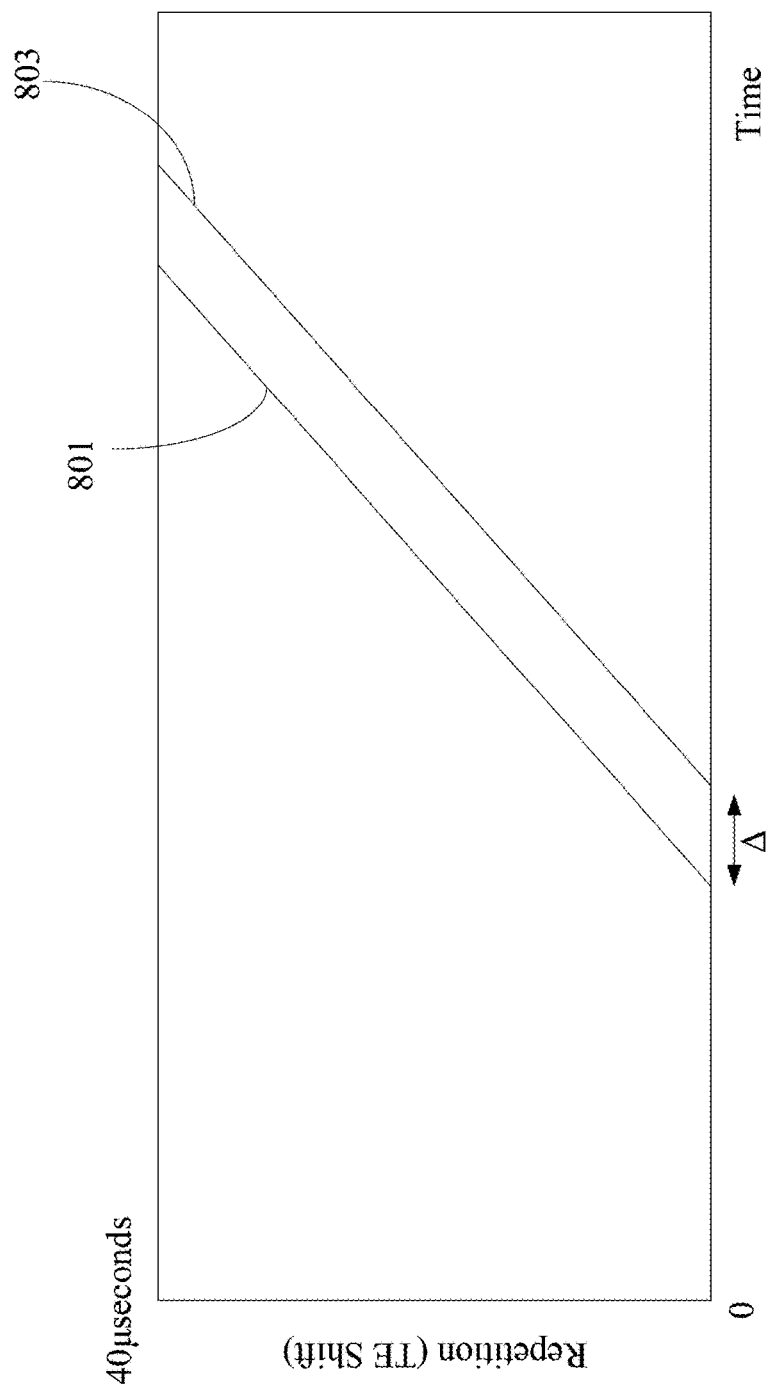
FIG. 8A depicts according to an embodiment, an exemplary graph depicting ideal echo positions and measured peak positions of the acquired signal data for a predetermined number of iterations.

FIG. 8A depicts an exemplary graph depicting the ideal echo position and the measured peak of the acquired signal data for N=40 iterations. Note that at each iteration, the time duration between the RF pulses can be incremented by a predetermined amount (e.g., 1 microsecond). Further, an increment in the time duration between the input RF pulses results in a shift of the ideal position of the echo signal.

In FIG. 8A, the shift in the echo position is plotted on the Y-axis and the parameter time is plotted on the X-axis. Curve 801 depicts the ideal echo position for the N iterations, and curve 803 corresponds to the measured peaks of the acquired data signal. The displacement between the curves (represented as A) corresponds to a measure of a time-shift of a time origin of the corresponding input RF pulses.

Figure 8B:
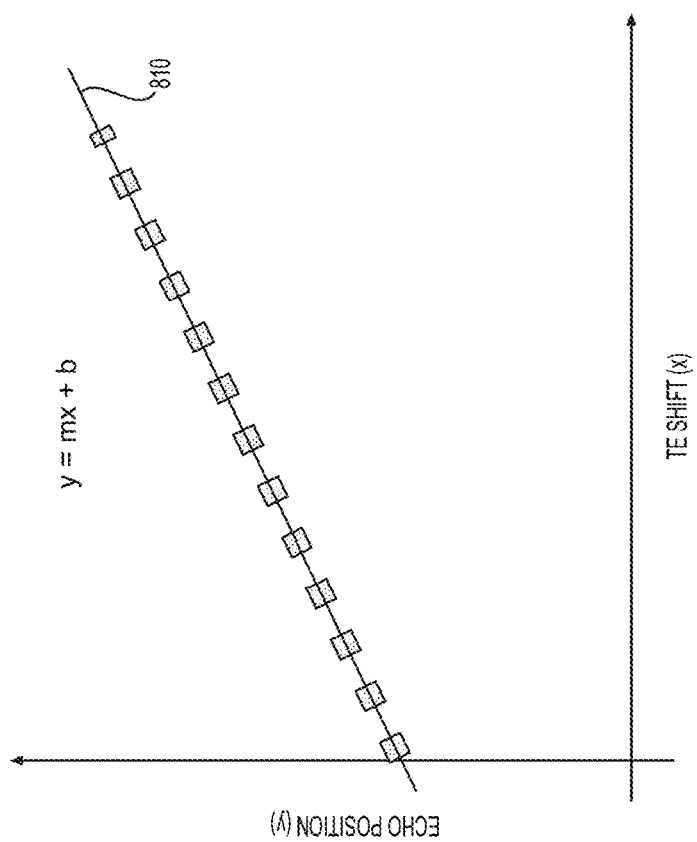
FIG. 8B is an exemplary graph depicting measured peak positions of the acquired signal data plotted against time-shifts in the ideal positions of the occurrence of the echo signal.

FIG. 8B depicts an exemplary graph of the measured peak positions of the acquired signal data plotted against shifts in the ideal positions of the echo signal. The measured peak positions of the acquired signal data (for the N iterations) are plotted on the Y-axis, and the shifts in the ideal echo positions are plotted on the X-axis. In one embodiment, a fitting operation for determining a slope and an intercept of the line y=mx+b can be performed, wherein the parameter b is the intercept value of the line y=mx+b on the Y-axis. In other words, the intercept b is a measure of the peak position for a shift of zero between the time duration of the RF pulses. Accordingly, by determining the intercept value of the line, the time shift of the time origin can be computed as a difference of the ideal echo position and the value of the intercept b on the Y-axis.

As stated above, the time duration between the RF pulses is controllable such that one can determine the ideal position of the spin-echo exactly within the sampling window. While performing a predetermined number of iterations, the time-duration between successive RF pulses is incremented in a predetermined manner. Incrementing the time-duration between RF pulses provides the advantageous ability of improving SNR measurements as well as obtaining an accurate estimate of the time origin.

While aspects of the present disclosure have been described in conjunction with the specific embodiments thereof that are proposed as examples, alternatives, modifications, and variations to the examples may be made. It should be noted that, as used in the specification and the appended claims, the singular forms "a," "an," and "the" include plural referents unless the context clearly dictates otherwise.

The invention claimed is:

1. A method for determining a time origin of an input RF pulse of a plurality of input RF pulses, the method comprising:
generating, by circuitry, an RF echo based on the plurality of input RF pulses, a time-duration between the input RF pulses being controllable in order to determine a time instance corresponding to an ideal position of the RF echo;
computing a time-difference between a time corresponding to a measured peak of an acquired data signal and the time instance corresponding to the ideal position of the RF echo, the computed time difference corresponding to a measure of a time-shift of the time origin of the input RF pulse;
repeating, for a predetermined number of iterations, the steps of generating the RF echo based acquiring the data signal;
computing, for each subsequent iteration, a time-difference between a measured peak of the data signal that is subsequently acquired and an ideal position of a subsequent RF echo; and
computing the measure of the time-shift of the time origin of the input RF pulse based on the computed subsequent time-differences.

2. The method of claim 1, wherein the plurality of input RF pulses have a substantially similar time-duration, amplitude, waveform shape, and flip-angle.

3. The method of claim 1, further comprising:
applying a gradient waveform having a uniform amplitude for an amount of time lasting from a time of input of the plurality of input RF pulses to a time of acquisition of the data signal.

4. The method of claim 1, wherein the plurality of input RF pulses is a pair of input RF pulses.

5. The method of claim 1, further comprising:
incrementing, by a predetermined amount by the circuitry, a time duration between the input RF pulses of the subsequent iterations.

6. A method for determining a time origin of an input RF pulse of a plurality of input RF pulses, the method comprising:
generating, by circuitry, an RF echo based on the plurality of input RF pulses, a time-duration between the input RF pulses being controllable in order to determine a time instance corresponding to an ideal position of the RF echo; and
computing a time-difference between a time corresponding to a measured peak of an acquired data signal and the time instance corresponding to the ideal position of the RF echo, the computed time difference corresponding to a measure of a time-shift of the time origin of the input RF pulse, wherein
the plurality of input RF pulses includes at least three input RF pulses.

7. A method for determining a time origin of an input RF pulse of a plurality of input RF pulses, the method comprising:
generating, by circuitry, an RF echo based on the plurality of input RF pulses, a time-duration between the input RF pulses being controllable in order to determine a time instance corresponding to an ideal position of the RF echo;
computing a time-difference between a time corresponding to a measured peak of an acquired data signal and the time instance corresponding to the ideal position of the RF echo, the computed time difference corresponding to a measure of a time-shift of the time origin of the input RF pulse;
repeating, for a predetermined number of iterations, the steps of generating the RF echo based acquiring the data signal; and
generating, by the circuitry, a line based on data corresponding to occurrences of the subsequent peaks of the acquired data signals, and associated time-shifts in the occurrences of the subsequent peaks, the time-shifts corresponding to the incremented time durations between the input RF pulses of the subsequent iterations.

8. A device for determining a time origin of an input RF pulse of a plurality of input RF pulses, the device comprising:
circuitry configured to
generate an RF echo based on the plurality of input RF pulses, a time-duration between the input RF pulses being controllable in order to determine a time instance corresponding to an ideal position of the RF echo,
compute a time-difference between a time corresponding to a measured peak of an acquired data signal and the time instance corresponding to the ideal position of the RF echo, the computed time difference corresponding to a measure of a time-shift of the time origin of the input RF pulse,
repeat, for a predetermined number of iterations, the steps of generating the RF echo based acquiring the data signal,
compute for each subsequent iteration, a time-difference between a measured peak of the subsequently acquired data signal and an ideal position of a subsequent RF echo, and
compute the measure of the time-shift of the time origin of the input RF pulse based on the computed subsequent time-differences.

9. The device of claim 8, wherein the circuitry is configured to generate the RF echo based on the plurality of input RF pulses, which have a substantially similar time-duration, amplitude, waveform shape, and flip-angle.

10. The device of claim 8, wherein the circuitry is further configured to apply a gradient waveform having a uniform amplitude for an amount of time lasting from a time of input of the plurality of input RF pulses to a time of acquisition of the data signal.

11. The device of claim 10, wherein the circuitry is configured to generate the RF echo based on the plurality of input RF pulses, which is a pair of input RF pulses.

12. The device of claim 8, wherein the circuitry is further configured to:
increment by a predetermined amount, a time duration between the input RF pulses of the subsequent iterations.

13. A device for determining a time origin of an input RF pulse of a plurality of input RF pulses, the device comprising:
circuitry configured to
generate an RF echo based on the plurality of input RF pulses, a time-duration between the input RF pulses being controllable in order to determine a time instance corresponding to an ideal position of the RF echo,
compute a time-difference between a time corresponding to a measured peak of an acquired data signal and the time instance corresponding to the ideal position of the RF echo, the computed time difference corresponding to a measure of a time-shift of the time origin of the input RF pulse, wherein the circuitry is further configured to repeat the generating and the acquiring steps for a predetermined number of iterations, and
generate a line based on data corresponding to occurrences of the subsequent peaks of the acquired data signals, and associated time-shifts in the occurrences of the subsequent peaks, the time-shifts corresponding to the incremented time durations between the input RF pulses of the subsequent iterations.

14. A device for determining a time origin of an input RF pulse of a plurality of input RF pulses, the device comprising:
circuitry configured to
generate an RF echo based on the plurality of input RF pulses, a time-duration between the input RF pulses being controllable in order to determine a time instance corresponding to an ideal position of the RF echo,
compute a time-difference between a time corresponding to a measured peak of an acquired data signal and the time instance corresponding to the ideal position of the RF echo, the computed time difference corresponding to a measure of a time-shift of the time origin of the input RF pulse, and
generate the RF echo based on the plurality of input RF pulses, which includes at least three input RF pulses.

* * * * *